United States Patent
Yu et al.

(10) Patent No.: US 9,911,829 B2
(45) Date of Patent: Mar. 6, 2018

(54) FINFET WITH BOTTOM SIGE LAYER IN SOURCE/DRAIN

(71) Applicant: Taiwan Semiconductor Manufacturing Company, Ltd., Hsin-Chu (TW)

(72) Inventors: Ming-Hua Yu, Hsin-Chu (TW); Pei-Ren Jeng, Chu-Bei (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/043,765

(22) Filed: Feb. 15, 2016

(65) Prior Publication Data

US 2016/0163836 A1    Jun. 9, 2016

Related U.S. Application Data

(60) Division of application No. 14/607,005, filed on Jan. 27, 2015, now Pat. No. 9,293,581, which is a continuation of application No. 13/800,817, filed on Mar. 13, 2013, now Pat. No. 8,963,258.

(51) Int. Cl.
| | |
|---|---|
| *H01L 29/66* | (2006.01) |
| *H01L 29/78* | (2006.01) |
| *H01L 29/06* | (2006.01) |

(52) U.S. Cl.
CPC .... *H01L 29/66795* (2013.01); *H01L 29/0657* (2013.01); *H01L 29/6659* (2013.01); *H01L 29/785* (2013.01); *H01L 29/7833* (2013.01); *H01L 29/7848* (2013.01)

(58) Field of Classification Search
CPC ............ H01L 29/0657; H01L 29/6659; H01L 29/66795; H01L 29/7833; H01L 29/7848; H01L 29/785; H01L 29/66636
See application file for complete search history.

(56) References Cited

U.S. PATENT DOCUMENTS

| | | | |
|---|---|---|---|
| 6,921,982 B2 | 7/2005 | Joshi et al. | |
| 7,015,106 B2 | 3/2006 | Yoon et al. | |
| 7,723,797 B2 | 5/2010 | Kim et al. | |
| 8,120,119 B2 | 2/2012 | Fischer et al. | |
| 8,278,718 B2 | 10/2012 | Fischer et al. | |
| 8,367,528 B2 | 2/2013 | Bauer et al. | |
| 8,546,863 B2 | 10/2013 | Huerta et al. | |
| 8,623,728 B2 | 1/2014 | Chang et al. | |
| 8,629,426 B2 | 1/2014 | Lin et al. | |
| 8,767,457 B2 | 7/2014 | Tang et al. | |
| 8,963,258 B2 * | 2/2015 | Yu ..................... | H01L 29/66795 257/328 |

(Continued)

FOREIGN PATENT DOCUMENTS

| | | |
|---|---|---|
| CN | 101986423 A | 3/2011 |
| CN | 101097956 B | 6/2012 |

(Continued)

*Primary Examiner* — Michael Trinh
(74) *Attorney, Agent, or Firm* — Slater Matsil, LLP

(57) ABSTRACT

A FinFET includes a substrate, a fin structure on the substrate, a source in the fin structure, a drain in the fin structure, a channel in the fin structure between the source and the drain, a gate dielectric layer over the channel, and a gate over the gate dielectric layer. At least one of the source and the drain includes a bottom SiGe layer.

20 Claims, 7 Drawing Sheets

(56) References Cited

U.S. PATENT DOCUMENTS

| | | |
|---|---|---|
| 9,293,581 B2 * | 3/2016 | Yu .................... H01L 29/66795 |
| 2005/0227447 A1 | 10/2005 | Hsieh |
| 2006/0060916 A1 | 3/2006 | Girdhar et al. |
| 2006/0208320 A1 | 9/2006 | Tsuchiya et al. |
| 2007/0241399 A1 | 10/2007 | Irisawa et al. |
| 2008/0001187 A1 | 1/2008 | Booth et al. |
| 2008/0237641 A1 | 10/2008 | Oh et al. |
| 2009/0075029 A1 * | 3/2009 | Thomas ............ H01L 21/02381 428/173 |
| 2010/0117138 A1 | 5/2010 | Huerta et al. |
| 2011/0024804 A1 | 2/2011 | Chang et al. |
| 2011/0180851 A1 * | 7/2011 | Doyle ............. H01L 21/823807 257/192 |
| 2011/0272739 A1 * | 11/2011 | Lee ................... H01L 29/66795 257/192 |
| 2012/0068268 A1 | 3/2012 | Hsiao et al. |
| 2012/0168838 A1 | 7/2012 | Marukame et al. |
| 2012/0228628 A1 | 9/2012 | Onoda et al. |
| 2013/0001591 A1 | 1/2013 | Wu et al. |
| 2014/0001525 A1 | 1/2014 | Kajiyama |
| 2014/0054546 A1 | 2/2014 | Liu et al. |
| 2014/0054648 A1 | 2/2014 | Itokawa et al. |
| 2014/0070377 A1 | 3/2014 | Yu et al. |
| 2014/0134818 A1 | 5/2014 | Cheng et al. |
| 2014/0252482 A1 | 9/2014 | Huang et al. |

FOREIGN PATENT DOCUMENTS

| | | |
|---|---|---|
| JP | 2007220809 A | 8/2007 |
| JP | 2012231168 A | 11/2012 |
| KR | 20130007412 | 1/2013 |

* cited by examiner

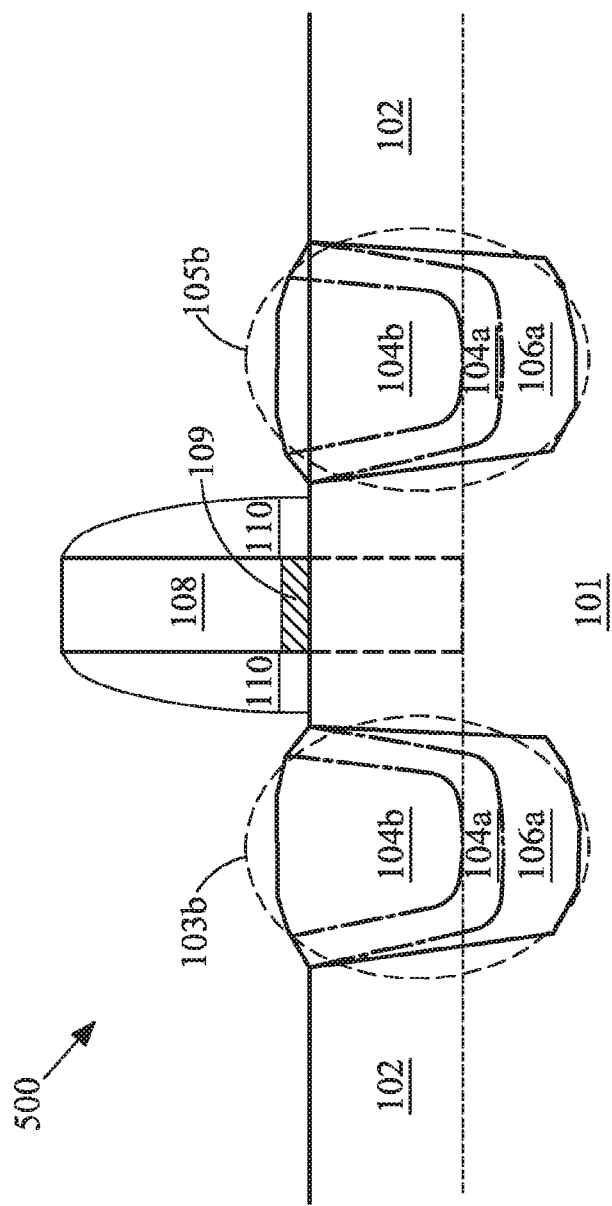

FINFET WITH BOTTOM SIGE LAYER IN SOURCE/DRAIN

PRIORITY CLAIM

This application is a divisional of U.S. patent application Ser. No. 14/607,005, filed on Jan. 27, 2015, now U.S. Pat. No. 9,291,581 issued on Mar. 22, 2016, and entitled "FinFET with Bottom SiGe Layer in Source/Drain," which claims priority as a continuation of U.S. patent application Ser. No. 13/800,817, filed on Mar. 13, 2013, now U.S. Pat. No. 8,963,258 issued on Feb. 24, 2015, and entitled "FinFET with Bottom SiGe Layer in Source/Drain," which application is incorporated herein by reference.

TECHNICAL FIELD

The present disclosure relates generally to a semiconductor device, more particularly a FinFET.

BACKGROUND

In some FinFET devices, weak drive current and short channel effects are challenging issues as the size of the devices is reduced. A FinFET with improved drive current and reduced short channel effects is desired.

BRIEF DESCRIPTION OF THE DRAWINGS

Reference is now made to the following descriptions taken in conjunction with the accompanying drawings, in which:

FIG. 5 is a schematic diagram of yet another exemplary FinFET according to some embodiments.

DETAILED DESCRIPTION

Figure 1:
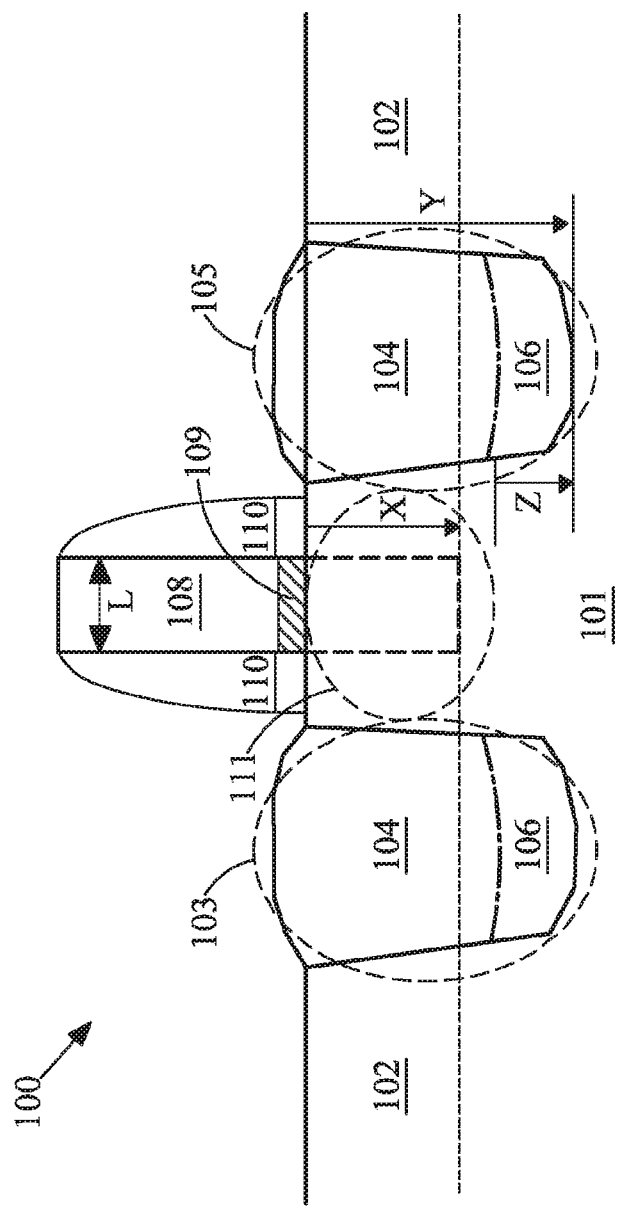
FIG. 1 is a schematic diagram of an exemplary FinFET according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary FinFET 100 according to some embodiments. The FinFET 100 includes a substrate 101, a fin structure 102 formed on the substrate, a source 103 and a drain 105 formed in the fin structure 102, a channel 111 in the fin structure 102 between the source 103 and the drain 105. A gate dielectric layer 109 is formed over the channel and a gate 108 is formed over the gate dielectric layer 109. At least one of the source 103 and the drain 105 includes a bottom SiGe layer 106. Spacers 110 are formed adjacent to the gate 108. In some embodiments, the FinFET 100 can be isolated by shallow trench isolation (STI) structure (e.g., $SiO_2$, not shown) from adjacent devices.

In some embodiments, the FinFET 100 is an N-type FinFET. The substrate comprises Si or any other suitable material. The source 103 and the drain 105 include a first layer 104 comprising SiP, SiCP, or any other suitable material. The first layer 104 is disposed over the bottom SiGe layer 106. In some embodiments, the bottom SiGe layer 106 is an epitaxial layer formed at the bottom of the first layer 104 comprising SiP or SiCP. The spacers 110 comprise SiN, SiCN, SiCON, other dielectric, or any other suitable material.

In some embodiments, the volume ratio of SiGe in the bottom SiGe layer 106 to the first layer 104 (SiP or SiCP) ranges from 10% to 40%. In some embodiments, the phosphorus (P) concentration in the first layer 104 ranges from $5e20\ cm^{-3}$ to $1e22\ cm^{-3}$. In some embodiments, the first layer 104 comprises SiCP, and the carbon doping percentage ranges from 0.5% to 2%.

In some embodiments, the height X of the fin structure 102, a height Y of the source 103 or the drain 105, and a height Z of the bottom SiGe layer 106 has a relationship of $Z \leq Y-X$. In some examples, X ranges from 30 nm to 40 nm, Y ranges from 45 nm to 60 nm, Z ranges from 5 nm to 15 nm, and the gate 108 length L ranges from 15 nm to 30 nm. The top of the source 103 and the drain 105 may be 5 nm-20 nm higher than the fin structure 102 in some embodiments. The bottom of the source 103 and the drain 105 may be below the fin structure 102 in recesses formed on the substrate 101 in some embodiments. The dimension of the FinFET 100 can be varied depending on the device design and application.

Figure 2:
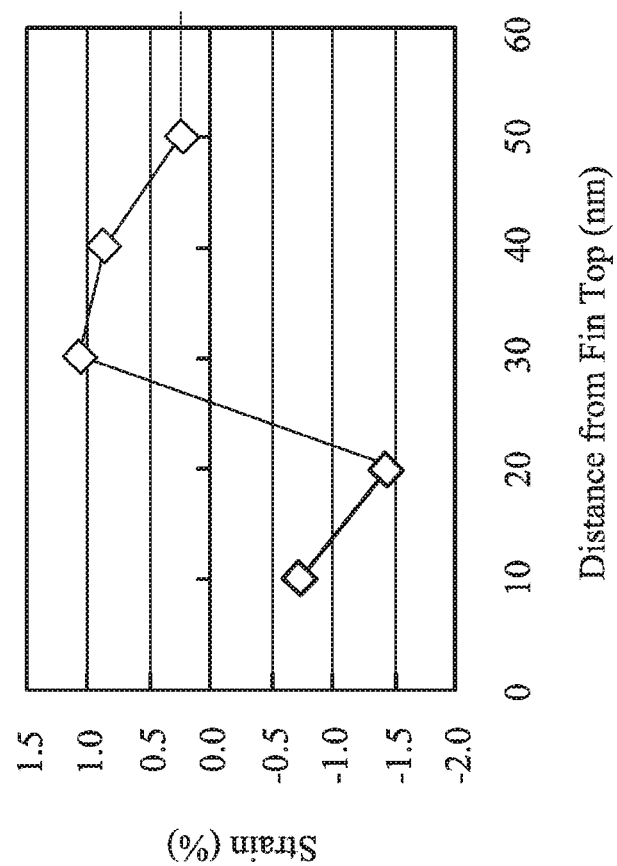
FIG. 2 is a plot of channel strain vs. distance from Fin top for the exemplary FinFET of FIG. 1 according to some embodiments.

FIG. 2 is a plot of channel strain vs. distance from Fin top for the exemplary FinFET 100 of FIG. 1 according to some embodiments. The channel 111 comprises Si and the bottom SiGe layer 106 applies compressive stress to the adjacent area (about 30 nm-40 nm from the top of the fin structure 102) of the channel 111 as shown in FIG. 2 with positive strain values). The bottom SiGe layer 106 induces tensile stress to the upper area (0 nm-20 nm from the top of the fin structure 102) of the channel 111 as shown in FIG. 2 with negative strain values). The induced tensile stress results in better mobility gain in the upper area of the channel 111.

Figure 3A:
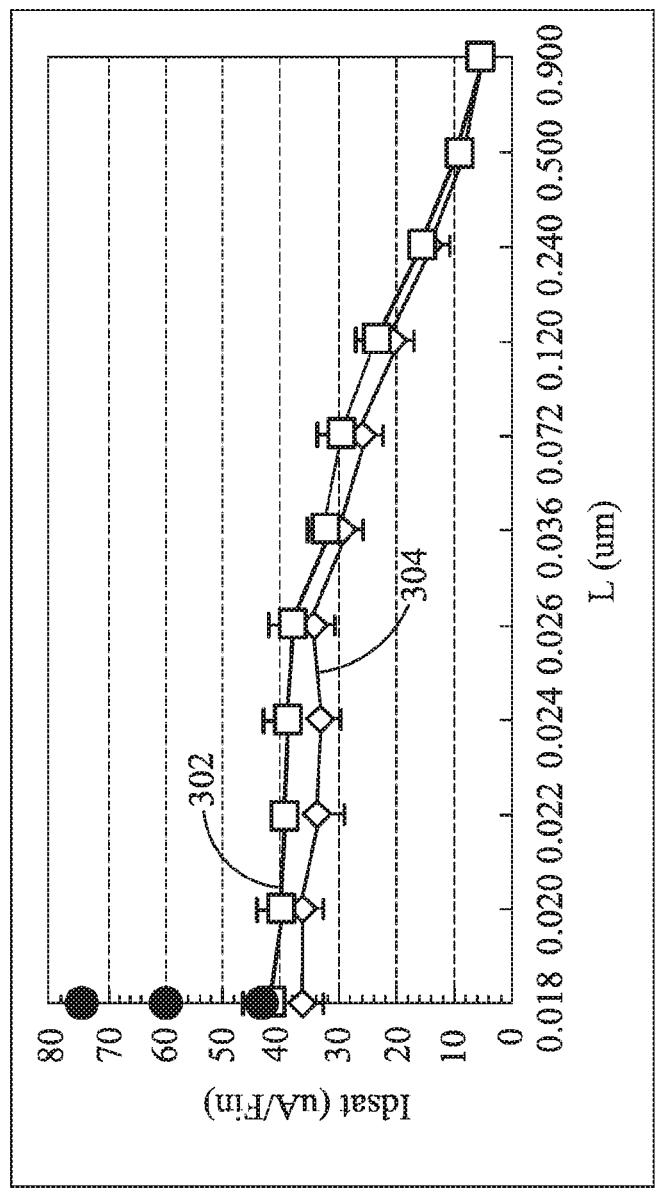
FIG. 3A is a plot of drive current vs. gate length of the exemplary FinFET in FIG. 1 according to some embodiments.

FIG. 3A is a plot of drive current vs. gate length of the exemplary FinFET 100 in FIG. 1 according to some embodiments. The curve 302 of the FinFET 100 shows improved drive current (Idsat) performance compared to the curve 304 of some other FinFET over various gate 108 length (L), resulting from better mobility gain.

Figure 3B:
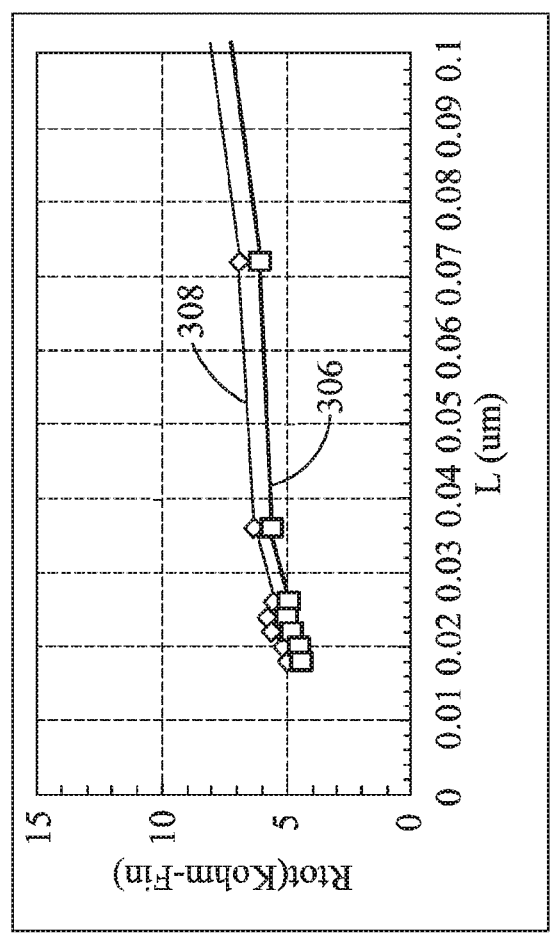
FIG. 3B is a plot of total resistance vs. gate length of the exemplary FinFET in FIG. 1 according to some embodiments.

FIG. 3B is a plot of total resistance vs. gate length of the exemplary FinFET 100 in FIG. 1 according to some embodiments. The total resistance (Rtot) is the sum of channel resistance and contact resistance. The curve 306 of the FinFET 100 shows reduced total resistance (Rtot) compared to the curve 308 of some other FinFET over various gate 108 length (L).

Thus, the FinFET 100 shows improved performance to overcome short channel effects, while having a high doping concentration of phosphorus for an N-type device in some embodiments. The phosphorus (P) concentration of the first layer 104 ranges from $5e20$ $cm^{-3}$ to $1e22$ $cm^{-3}$ in some embodiments. In some embodiments, the phosphorus (P) concentration of the first layer 104 ranges from $1e21$ $cm^{-3}$ to $4e21$ $cm^{-3}$.

Figure 4:
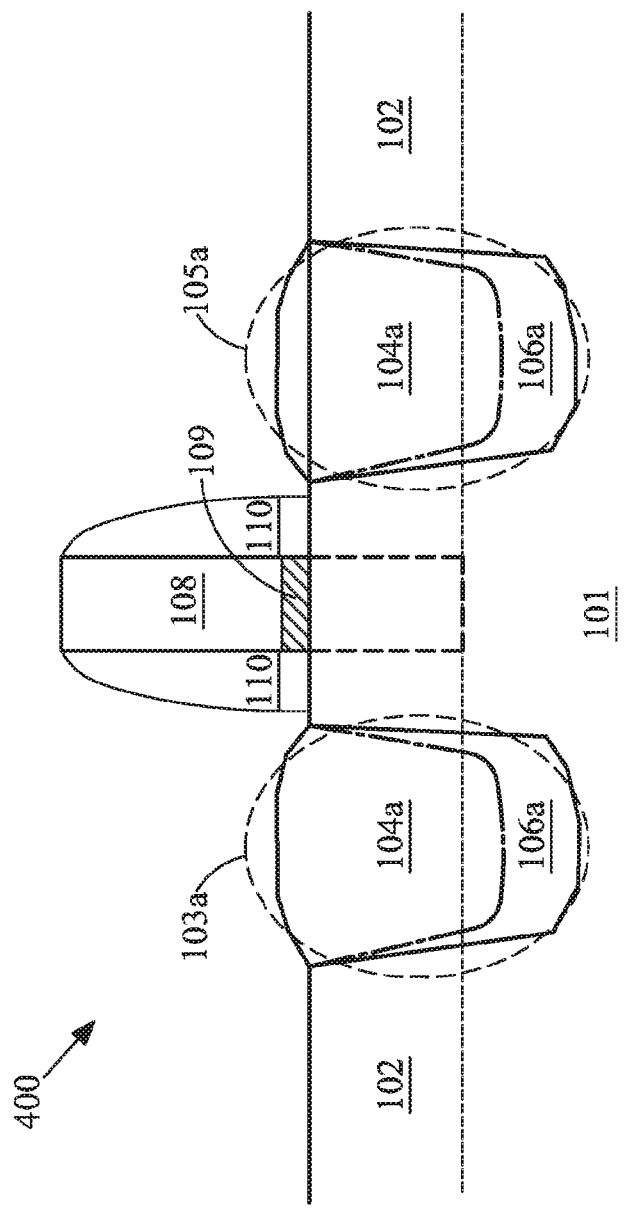
FIG. 4 is a schematic diagram of another exemplary FinFET according to some embodiments.

FIG. 4 is a schematic diagram of another exemplary FinFET 400 according to some embodiments. The FinFET 400 is similar to the FinFET 100 in FIG. 1 and at least one of the source 103a and the drain 105a includes a SiGe layer 106a. The source 103a/drain 105a of the FinFET 400 includes a sidewall SiGe layer in addition to the bottom SiGe layer to form the SiGe layer 106a. In some embodiments, an epitaxial SiGe layer 106a is formed to the sidewall and bottom of the first layer 104a comprising SiP or SiCP.

FIG. 5 is a schematic diagram of yet another exemplary FinFET according to some embodiments. The FinFET 500 is similar to the FinFET 400 in FIG. 4 and at least one of the source 103b and the drain 105b includes a SiGe layer 106a. The source 103b/drain 105b of the FinFET 500 includes a sidewall SiGe layer in addition to the bottom SiGe layer to form the SiGe layer 106a.

In addition, the source 103b/the drain 105b of the FinFET 500 further comprise a second layer 104b over the first layer 104a. The second layer 104b has a higher dopant concentration than the first layer 104a. In some embodiments, the first layer 104a and the second layer 104b comprise SiP or SiCP, and the first layer 104a has a phosphorus concentration ranging from $5e20$ $cm^{-3}$ to $2e21$ $cm^{-3}$, while the second layer 104b has a phosphorus concentration ranging from $1e21$ $cm^{-3}$ to $1e22$ $cm^{-3}$.

In some examples, the first layer 104a has a phosphorus concentration ranging from $7e20$ $cm^{-3}$ to $1e21$ $cm^{-3}$, while the second layer 104b has a phosphorus concentration ranging from $1e21$ $cm^{-3}$ to $4e21$ $cm^{-3}$. In some embodiments, the first layer 104a and the second layer 104b comprise SiCP, and the carbon doping percentage ranges from 0.5% to 2%.

Figure 6B:
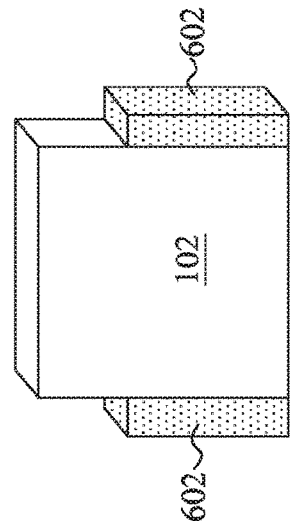
FIGS. 6A-6E are intermediate steps of fabricating the exemplary FinFET in FIG. 4 according to some embodiments.
Figure 6A:
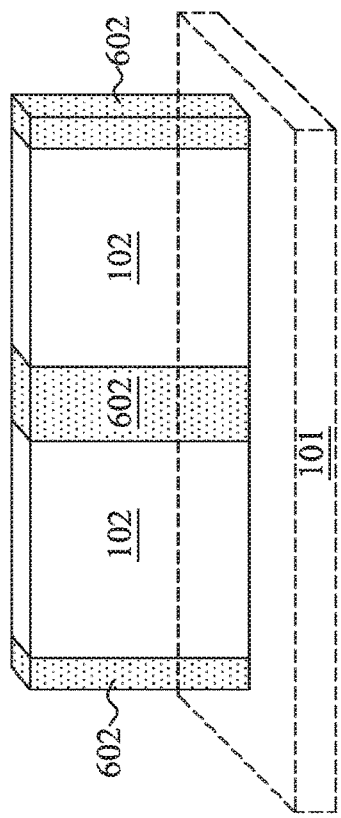

FIGS. 6A-6E are intermediate steps of fabricating the exemplary FinFET in FIG. 4 according to some embodiments. In FIG. 6A, a fin structure 102 and shallow trench isolation structure 602 are formed on a substrate 101 by dry etching and chemical vapor deposition (CVD), for example. (The substrate 101 is not shown in subsequent steps for simplicity.) In some embodiments, the substrate 101 comprises Si and the STI comprises $SiO_2$.

In FIG. 6B, the STI is etched by wet etching using hydrogen chloride to form the fin structure 102, for example.

Figure 6E:
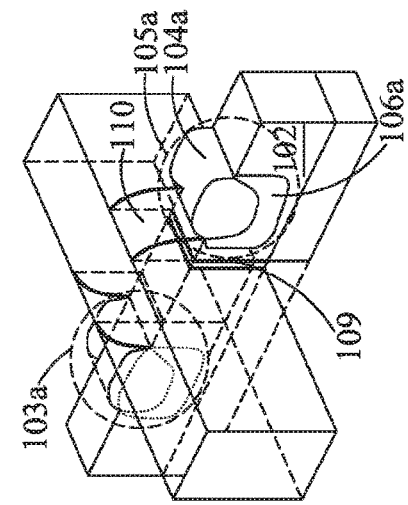
Figure 6D:
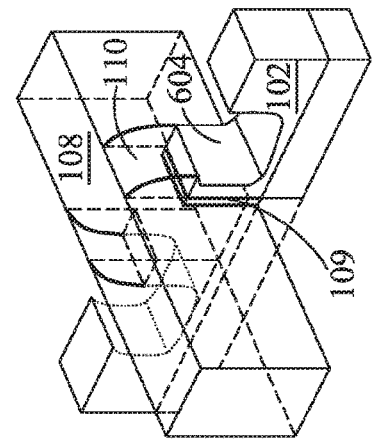
Figure 6C:
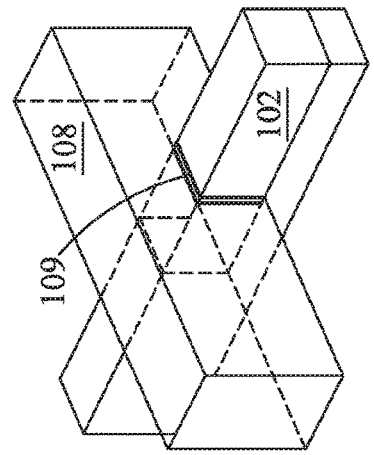

In FIG. 6C, the gate dielectric layer 109 and the gate 108 are formed. For example, the gate dielectric layer 109 such as $SiO_2$ or any other suitable material can be formed by a high temperature CVD. The gate 108 such as polysilicon or metal can be formed by CVD or atomic layer (AL) CVD.

In FIG. 6D, spacers 110 (e.g., SiN) adjacent to the gate 108 are formed by depositing SiN using ALCVD or high temperature CVD and recesses 604 in the fin structure 102 (and in the substrate 101) are etched by plasma etching, for example.

In FIG. 6E, the source 103a and the drain 105a are formed. For example, the SiGe layer 106a (including bottom SiGe and sidewall SiGe) is deposited by CVD. Then the first layer 104a (e.g., SiP) is deposited by CVD.

Even though the FinFET 400 in FIG. 4 is shown for the exemplary fabrication steps in FIGS. 6A-6E, the FinFET 100 in FIG. 1 and the FinFET 500 in FIG. 5 can be fabricated in similar steps.

According to some embodiments, a FinFET includes a substrate, a fin structure on the substrate, a source in the fin structure, a drain in the fin structure, a channel in the fin structure between the source and the drain, a gate dielectric layer over the channel, and a gate over the gate dielectric layer. At least one of the source and the drain includes a bottom SiGe layer.

According to some embodiments, a method for forming a FinFET includes forming a fin structure on a substrate. A source and a drain are formed and at least one of the source and the drain includes a bottom SiGe layer. A gate dielectric layer is formed over a channel between the source and the drain. A gate is formed over the gate dielectric layer.

In one aspect, embodiments described herein may provide for a method for forming a FinFET, including forming a fin structure extending from and above a major surface of a substrate, and recessing a source region into the fin and a drain region into the fin. The method further includes forming a SiGe layer on a region selected from the group consisting of a bottom of the source region, a bottom of the drain region, and both, forming a source in the source region and a drain in the drain region, forming a gate dielectric layer over a channel between the source and the drain, and forming a gate over the gate dielectric layer.

In another aspect, embodiments described herein may provide for a method including forming on a substrate, a semiconductor fin structure surrounded by an isolation structure, and etching back the isolation structure to have a topmost surface below a topmost surface of the fin structure. The method includes forming a gate structure across a mid section of the fin structure, and forming spaces on sidewalls of the gate structure, The method also includes etching a source recess in the fin on a first side of the gate structure and etching a drain recess in the fin on a second side of the gate structure opposite the first side, forming a SiGe layer along a bottom of the source recess, the drain recess, or both the source recess and the drain recess, and forming a first layer having a lattice constant different than the lattice constant of SiGe atop the SiGe layer in the source recess and the drain recess.

In yet another aspect, embodiments described herein may provide for a method including, forming a recess in a semiconductor fin having a first lattice constant, forming on a bottom of the recess a bottom layer having a second lattice constant different than the first lattice constant, and forming on the bottom layer a first layer having a third lattice constant different than the first lattice constant, wherein the volume ratio of the bottom later to the first layer is from 10% to 40%.

A skilled person in the art will appreciate that there can be many embodiment variations of this disclosure. Although the embodiments and their features have been described in detail, it should be understood that various changes, substitutions, and alterations can be made herein without departing from the spirit and scope of the embodiments. Moreover, the scope of the present application is not intended to be limited to the particular embodiments of the process, machine, manufacture, and composition of matter, means, methods, and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method for forming a FinFET, comprising:
    forming a fin structure extending from and above a major surface of a substrate;
    forming an isolation structure around the fin structure on the major surface of the substrate;
    recessing a source region into the fin structure and a drain region into the fin structure, bottom surfaces of the source region and the drain region extending below bottom surfaces of the isolation structure;
    forming a SiGe layer on a region selected from the group consisting of a bottom of the source region, a bottom of the drain region, and both;
    forming a source in the source region and a drain in the drain region;
    forming a gate dielectric layer over a channel between the source and the drain; and
    forming a gate over the gate dielectric layer.

2. The method of claim 1, wherein the SiGe layer is deposited by chemical vapor deposition.

3. The method of claim 1, wherein recessing a source region into the fin structure includes etching a recess extending from a topmost surface of the fin structure into the substrate.

4. The method of claim 1, further including forming the SiGe layer on a region selected from the group consisting of a sidewall of the source region, a sidewall of the drain region, and both.

5. The method of claim 1, wherein forming the source and the drain comprises forming a first layer comprising SiP or SiCP, the first layer being disposed over the SiGe layer.

6. The method of claim 5, wherein forming the source and the drain comprises forming a second layer comprising SiP or SiCP on the first layer comprising SiP or SiCP.

7. The method of claim 1, wherein the SiGe layer is also formed on a second region on a region selected from the group consisting of a sidewalls of the source region, sidewalls of the drain region, and sidewalls of both the source region and the drain region.

8. The method of claim 1, wherein the source comprises a first layer and a volume ratio of the SiGe layer to the first layer is from about 10% to about 40%.

9. The method of claim 1, wherein the fin structure is formed to a height X, the source or the drain or both is formed to a height Y, and the SiGe layer is formed to a height Z, wherein Z<Y–X.

10. A method comprising:
    forming on a major surface of a substrate, a fin structure and an isolation structure, the fin structure having a topmost surface above the major surface of the substrate, the fin structure surrounded by the isolation structure;
    etching back the isolation structure to have a topmost surface below the topmost surface of the fin structure;
    forming a gate structure across a mid section mid-section of the fin structure;
    forming spacers on sidewalls of the gate structure;
    etching a source recess in the fin structure on a first side of the gate structure and etching a drain recess in the fin structure on a second side of the gate structure opposite the first side, the source recess and the drain recess each extending from the topmost surface of the fin structure below the major surface of the substrate;
    forming a SiGe layer along a bottom of the source recess, the drain recess, or both the source recess and the drain recess; and
    forming a first layer having a lattice constant different than a lattice constant of SiGe atop the SiGe layer in the source recess and the drain recess.

11. The method of claim 10, further comprising forming the SiGe layer along sidewalls of the source recess, the drain recess, or both the source recess and the drain recess.

12. The method of claim 10, wherein forming the first layer includes depositing the first layer using a chemical vapor deposition process.

13. The method of claim 10, wherein forming the SiGe layer includes depositing the SiGe layer using a chemical vapor deposition process.

14. The method of claim 10, further comprising forming a second layer having a lattice constant different than a lattice constant of SiGe on the first layer.

15. The method of claim 10, wherein the source recess and the drain recess are formed by plasma etching the fin structure.

16. The method of claim 10, wherein forming the first layer comprises depositing SiP or SiCP by chemical vapor deposition.

17. The method of claim 10 wherein the SiGe layer is epitaxially grown in the source recess, the drain recess, or both the source recess and the drain recess.

18. A method comprising:
    forming a semiconductor fin extending from a major surface of a substrate, the semiconductor fin having a topmost surface above the major surface of the substrate;
    forming an isolation structure around the semiconductor fin on the major surface of the substrate;
    forming a recess in the semiconductor fin, the recess extending from the topmost surface of the semiconductor fin below the major surface of the substrate;
    forming on a bottom of the recess a bottom layer comprising SiGe;
    forming on the bottom layer a first layer, the first layer having a lattice constant different from a lattice constant of the bottom layer;
    forming a gate dielectric layer over a portion of the semiconductor fin adjacent the recess; and
    forming a gate over the gate dielectric layer.

19. The method of claim 18, wherein a volume ratio of the bottom layer to the first layer is between about 10% and about 40%.

20. The method of claim 18, wherein the first layer comprises SiP or SiCP, wherein the method further comprises forming on the first layer a second layer comprising SiP or SiCP, wherein a second phosphorus concentration of the second layer is higher than a first phosphorus concentration of the first layer.

\* \* \* \* \*